(12) United States Patent
Amano et al.

(10) Patent No.: US 9,980,420 B2
(45) Date of Patent: May 22, 2018

(54) ASSEMBLING MACHINE

(71) Applicant: FUJI MACHINE MFG. CO., LTD., Chiryu (JP)

(72) Inventors: Masafumi Amano, Obazaki (JP); Hiroshi Oike, Chiryu (JP); Hirotake Esaki, Ichinomiya (JP)

(73) Assignee: FUJI MACHINE MFG. Co., LTD., Chiryu (JP)

( * ) Notice: Subject to any disclaimer, the term of this patent is extended or adjusted under 35 U.S.C. 154(b) by 184 days.

(21) Appl. No.: 15/100,507

(22) PCT Filed: Dec. 2, 2013

(86) PCT No.: PCT/JP2013/082376
§ 371 (c)(1),
(2) Date: May 31, 2016

(87) PCT Pub. No.: WO2015/083220
PCT Pub. Date: Jun. 11, 2015

(65) Prior Publication Data
US 2016/0309630 A1    Oct. 20, 2016

(51) Int. Cl.
*B23P 19/00*    (2006.01)
*H05K 13/08*    (2006.01)
(Continued)

(52) U.S. Cl.
CPC .......... *H05K 13/08* (2013.01); *G06T 3/4053* (2013.01); *H05K 13/0408* (2013.01); *H05K 13/0452* (2013.01); *Y10T 29/53174* (2015.01)

(58) Field of Classification Search
CPC ......... Y10T 29/49826; Y10T 29/53178; Y10T 29/53191; Y10T 29/53174;
(Continued)

(56) References Cited

U.S. PATENT DOCUMENTS 6,986,196 B2 *  1/2006  Terui ................... H05K 13/021
                                                              29/739
8,339,445 B2 * 12/2012  Yoro ................... H01L 21/681
                                                              348/77
(Continued)

FOREIGN PATENT DOCUMENTS

JP        7-297598 A     11/1995
JP       11-191157 A      7/1999
(Continued)

OTHER PUBLICATIONS

International Search Report dated Feb. 4, 2014 in PCT/JP2013/082376 filed Dec. 2, 2013.
Extended European Search Report dated Nov. 2, 2016 in Patent Application No. 13898507.2.

*Primary Examiner* — Thiem Phan
(74) *Attorney, Agent, or Firm* — Oblon, McClelland, Maier & Neustadt, L.L.P.

(57) ABSTRACT

The assembling machine is provided with fiducial marks which are attached to a defined position on a moving head, and an image processing section which recognizes the holding state of the component by the holding member based on high resolution data which is generated by super-resolution processing which uses a plurality of items of image data. The image processing section includes a displacement amount calculation section which calculates each displacement amount of imaging positions of other items of image data in relation to the imaging position of reference data, a positioning processing section which performs the positioning of the other items of image data in relation to the reference data, and a reconstruction processing section which generates the high resolution data based on the plurality of items of image data which are positioned.

6 Claims, 9 Drawing Sheets

(51) Int. Cl.
  *G06T 3/40* (2006.01)
  *H05K 13/04* (2006.01)
(58) Field of Classification Search
  CPC ......... Y10T 29/49131; Y10T 29/53091; Y10T 29/4913; Y10T 29/49133; H01L 2224/7565; H01L 21/681; H05K 13/0413
  USPC ......... 29/739, 593, 740, 743, 759, 830, 832, 29/833, 834
  See application file for complete search history.

(56) References Cited

U.S. PATENT DOCUMENTS

| | | |
|---|---|---|
| 2007/0294875 A1 | 12/2007 | Hachiya et al. |
| 2011/0102606 A1 | 5/2011 | Toyomura et al. |

FOREIGN PATENT DOCUMENTS

| | | |
|---|---|---|
| JP | 2000-180119 A | 6/2000 |
| JP | 2005-11950 A | 1/2005 |
| JP | 2006-287199 A | 10/2006 |
| JP | 2008-306492 A | 12/2008 |
| JP | 2009-237650 A | 10/2009 |
| JP | 2011-101139 A | 5/2011 |
| JP | 2011-155050 A | 8/2011 |
| JP | 2013-26278 A | 2/2013 |
| JP | 2013-74337 A | 4/2013 |

\* cited by examiner

ASSEMBLING MACHINE

TECHNICAL FIELD

The present application relates to an assembling machine which transfers a component which is acquired at a supply position to an assembling position and attaches the component to an assembly.

BACKGROUND ART

The assembling machine is used as a component mounting machine which produces an electronic circuit product by mounting a plurality of electronic components onto a circuit board, or as manufacturing equipment which assembles power modules and the like. For example, in PTL 1, a configuration in which an electronic component in a supply position is sucked by a suction nozzle and the electronic component is mounted at an assembling position (a predetermined coordinate position on a circuit board) is disclosed as the component mounting machine described above. In the component mounting machine, a holding state of the electronic component is recognized based on image data which is acquired by imaging the electronic component which is held by the suction nozzle. By reflecting the recognized holding state in the mounting control, the component mounting machine obtains an improvement in the precision of the mounting control.

Incidentally, in an imaging device which images the component in the assembling machine such as the component mounting machine, many lens units in which a fixed focal length is set are adopted in consideration of the fact that a distance to an imaging target object is generally fixed, the installation costs, and the like. In the imaging device including such a lens unit, imaging is performed in a predetermined camera visual field at a resolution corresponding to the number of pixels of an imaging element which is installed in the imaging device. Here, in the lens unit, if the camera visual field is set such that a large component which has large external dimensions fits within the camera visual field, the area which is occupied by a small component in the image data when imaging a small component which has small external dimensions is small, and there is a concern that sufficient resolution may not be secured.

Therefore, in the lens unit of the imaging device, in order to acquire image data in which a small component is used as the target object and sufficient resolution is secured, it is necessary to set the camera visual field to be narrow to a certain extent. However, in such a setting, in a case in which a large component is used as the imaging target object, there is a concern that the large component will exceed the camera visual field. Therefore, PTL 2 discloses a component mounting machine which generates high resolution data using super-resolution processing and performs the mounting control based on the high resolution data.

CITATION LIST

Patent Literature

PTL 1: JP-A-2013-26278
PTL 2: JP-A-11-191157

BRIEF SUMMARY

Problem to be Solved

Incidentally, as described in PTL 2, multi-frame type super-resolution processing in which the high resolution data is generated using a plurality of items of image data is known. In the multi-frame type super-resolution processing, mainly, a process of positioning the plurality of items of image data and a process of reconstructing high resolution data are performed. For example, the positioning processing is performed based on the movement amount when a target object such as a component is moved relative to the imaging device.

Therefore, in a case in which an error arises between the instructed position and the actual position when the target object is moved relative to the imaging device, an error also arises in the positioning processing. When an error arises in the positioning processing in the multi-frame type super-resolution processing, the generated high resolution data contains an error. When the recognition of the holding state of the component is performed based on such high resolution data, there is a concern that the position and the angle of the component will be mistaken.

The present application was made in light of these issues, and an object thereof is to provide an assembling machine which is capable of acquiring high resolution image data which is used in the recognition of the holding state of a component by a holding member corresponding to various components, and is capable of improving precision of assembly control.

Means for Solving the Problem

An assembling machine according an aspect of the disclosure includes a holding member which acquires and holds a component which is supplied to a supply position, a moving head which supports one or a plurality of the holding members to be capable of lifting and lowering the holding member and which is capable of moving from the supply position to an assembling position at which an assembly is positioned, an imaging device which images the component which is held by the holding member, fiducial marks which are attached to a defined position of the moving head and which fit within a visual field of the imaging device when the imaging device images the component, an image processing section which generates high resolution data using super-resolution processing which uses a plurality of items of image data which are captured at imaging positions at which relative positions of the imaging device to the component differ from each other and recognizes a holding state of the component by the holding member based on the high resolution data, and a control device which transfers the component to the assembling position by controlling movement of the holding member based on a control program which is stored in advance and the holding state of the component which is recognized, in which the fiducial marks are set to dimensions that occupy a defined area in the visual field of the imaging device in a case in which the fiducial marks are imaged by the imaging device, and in which the image processing section includes a displacement amount calculation section which uses one item of the image data among the plurality of items of image data as reference data and calculates each displacement amount of the imaging positions of the other items of image data in relation to the imaging position of the reference data based on the fiducial marks included in each item of the image data, a positioning processing section which performs the positioning of the other items of image data in relation to the reference data based on each of the displacement amounts of the plurality of items of image data, and a reconstruction processing section which generates the high resolution data based on the plurality of items of image data which are positioned.

According to this configuration, in the super-resolution processing which uses a plurality of items of image data, that is, in the multi-frame type super-resolution processing, a positioning processing of the other items of image data in relation to the reference data is performed based on each displacement amount of the plurality of items of image data which is calculated by the displacement amount calculation section. Here, the displacement amount calculation section is configured to calculate the displacement amounts based on the fiducial marks contained in each item of image data. Therefore, even if, hypothetically, an error arises between the instructed position and the actual position when the target object (the component) is moved relative to the imaging device, it is possible to prevent the error from influencing the positioning processing. In other words, the positioning processing section performs the positioning processing of the image data regardless of the instructed position to the moving head when moving the component. Accordingly, the positioning processing section becomes capable of accurately positioning each item of the image data.

Accordingly, with regard to the lens unit of the imaging device, even if the camera visual field is set such that the large component fits therein, the image processing section is capable of generating high resolution data sufficient for the recognition of the holding state of the small component without using a high resolution imaging element. Therefore, the control device of the assembling machine is capable of acquiring the image data which is used in the recognition of the holding state corresponding to various components by using the high resolution data which is generated in this manner, and it is possible to improve the precision of the assembly control.

DESCRIPTION OF EMBODIMENTS

Hereinafter, the embodiments that embody the assembling machine of the present disclosure will be described with reference to the drawings. In the present embodiment, the assembling machine is a component mounting machine which uses a circuit board product which is produced by mounting electronic components on a circuit board (an assembly) as a target. The component mounting machine is a device which mounts a plurality of electronic components onto a circuit board in a manufacturing process of an integrated circuit, for example. For example, in the circuit board, cream solder is applied to mounting positions (assembling positions) of the electronic components by a screen printer, the circuit board is conveyed sequentially by a plurality of component mounting machines and the electronic components are mounted on the circuit board. Subsequently, the circuit board on which the electronic components are mounted forms an integrated circuit as a circuit board product by being conveyed into a reflow furnace and subjected to soldering.

First Embodiment (1-1. Overall Configuration of Component Mounting Machine)

Figure 1:
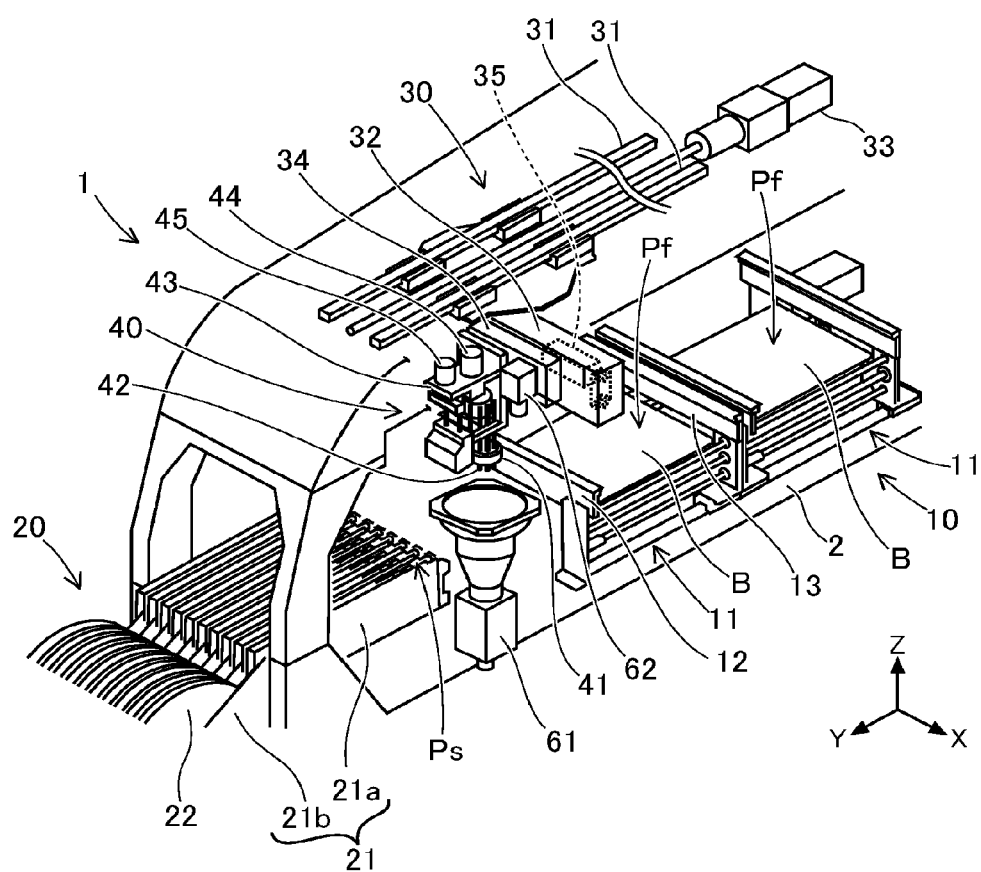
FIG. 1 is an overall diagram illustrating a component mounting machine in a first embodiment.

Description of the overall configuration of a component mounting machine 1 will be given with reference to FIGS. 1 and 2. The component mounting machine 1 is configured to include a board conveyance device 10, a component supply device 20, a component transfer device 30, a component camera 61, a board camera 62, and a control device 70. Each of the devices 10, 20, 30 and the component camera 61 are provided on a base 2 of the component mounting machine 1. As illustrated in FIG. 1, a horizontal width direction (a direction from the top left toward the bottom right of FIG. 1) of the component mounting machine 1 is set to an X-axis direction, a horizontal length direction (a direction from the top right toward the bottom left of FIG. 1) of the component mounting machine 1 is set to a Y-axis direction, and a vertical direction (an up-down direction of FIG. 1) is set to a Z-axis direction.

(1-1-1. Board Conveyance Device 10)

The board conveyance device 10 conveys a circuit board B in the X-axis direction and positions the circuit board B in a predetermined position. The board conveyance device 10 is a double conveyor type of device which is formed of a plurality of conveyance mechanisms 11 which are provided to line up in the Y-axis direction. The conveyance mechanism 11 includes a pair of guide rails 12 and 13 which guide the circuit board B which is placed on a conveyor belt which is not depicted in the drawings and is conveyed. The conveyance mechanism 11 conveys the circuit board B to a predetermined position in the X-axis direction when performing the mounting processing of an electronic component T and clamps the circuit board B using a clamping device. When the electronic component T is mounted onto the circuit board B, the conveyance mechanism 11 unclamps the circuit board B and conveys the circuit board B to the outside of the component mounting machine 1.

(1-1-2. Component Supply Device 20)

The component supply device 20 is a device which supplies the electronic component T to be mounted to the circuit board B. The component supply device 20 is disposed on the front portion side (the bottom left side of FIG. 1) of the component mounting machine 1 in the Y-axis direction. In the present embodiment, the component supply device 20 is a feeder type device which uses a plurality of cassette type feeders 21. The feeder 21 includes a feeder main body section 21a which is attached to the base 2 in a detachable manner, and a reel storage section 21b which is provided on the rear end side of the feeder main body section 21a. The feeder 21 holds a supply reel 22 in which a component-packed tape is wound by the reel storage section 21b.

The component-packed tape is formed of a carrier tape in which the electronic components T are stored at a predetermined pitch, and a top tape which is adhered to the top face of the carrier tape and covers the electronic components T. The feeder 21 pitch feeds the component-packed tape which is pulled out from the supply reel 22 by a pitch feed mechanism which is not depicted in the drawings. The feeder 21 peels the top tape from the carrier tape and exposes the electronic components T. Accordingly, the feeder 21 performs the supplying of the electronic component T such that a suction nozzle 42 of the component transfer device 30 is able to suck the electronic component T at a supply position Ps positioned at the front end side of the feeder main body section 21a.

(1-1-3. Component Transfer Device 30)

The component transfer device 30 holds the electronic component T which is supplied to the supply position Ps and transfers the electronic component T to a mounting position Pf (corresponding to an "assembling position" of the present disclosure) on the circuit board B. In the present embodiment, the component transfer device 30 is a Cartesian coordinate type device which is disposed above the board conveyance device 10 and the component supply device 20. In the component transfer device 30, a Y-axis slide 32 capable of moving in the Y-axis direction on a pair of Y-axis rails 31 which extend in the Y-axis direction is provided.

The Y-axis slide 32 is controlled by the operation of a Y-axis motor 33 via a ball screw mechanism. A moving table 34 is provided on the Y-axis slide 32 to be capable of moving in the X-axis direction. The moving table 34 is controlled by the operation of an X-axis motor 35 via a ball screw mechanism which is not depicted in the drawings. In addition to the configuration described above, the Y-axis slide 32 and the moving table 34 may be configured to be provided in a linear motion mechanism in which a linear motor is used, for example, and controlled by the operation of the linear motor.

A mounting head 40 (corresponding to the "moving head" of the present disclosure) is attached to the moving table 34 of the component transfer device 30. The mounting head 40 supports a plurality of suction nozzles 42 (corresponding to a "holding member" of the present disclosure) such that it is possible to lift and lower the suction nozzles 42 using a nozzle holder 41 (corresponding to a "holder member" of the present disclosure) capable of rotating around an R-axis which is parallel with the Z axis. The mounting head 40 is fixed to the moving table 34 via a frame 43. The top portion of the frame 43 supports an R-axis motor 44 and a Z-axis motor 45.

Figure 2:
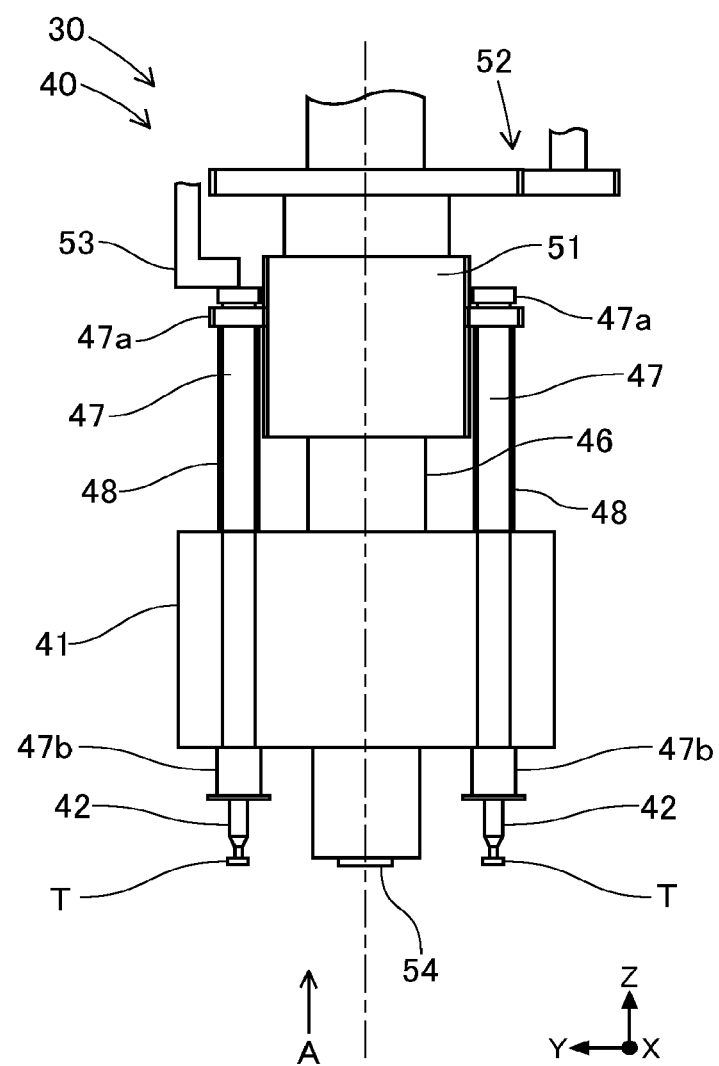
FIG. 2 is a front view in which a portion of a component mounting head is enlarged.

More specifically, the nozzle holder 41 of the mounting head 40 is formed with an overall shape which is columnar, and as illustrated in FIG. 2, the nozzle holder 41 is joined to an output shaft of the R-axis motor 44 via an index shaft 46. Accordingly, the nozzle holder 41 is configured to be possible to rotate using the R-axis motor 44 and the index shaft 46.

Figure 3:
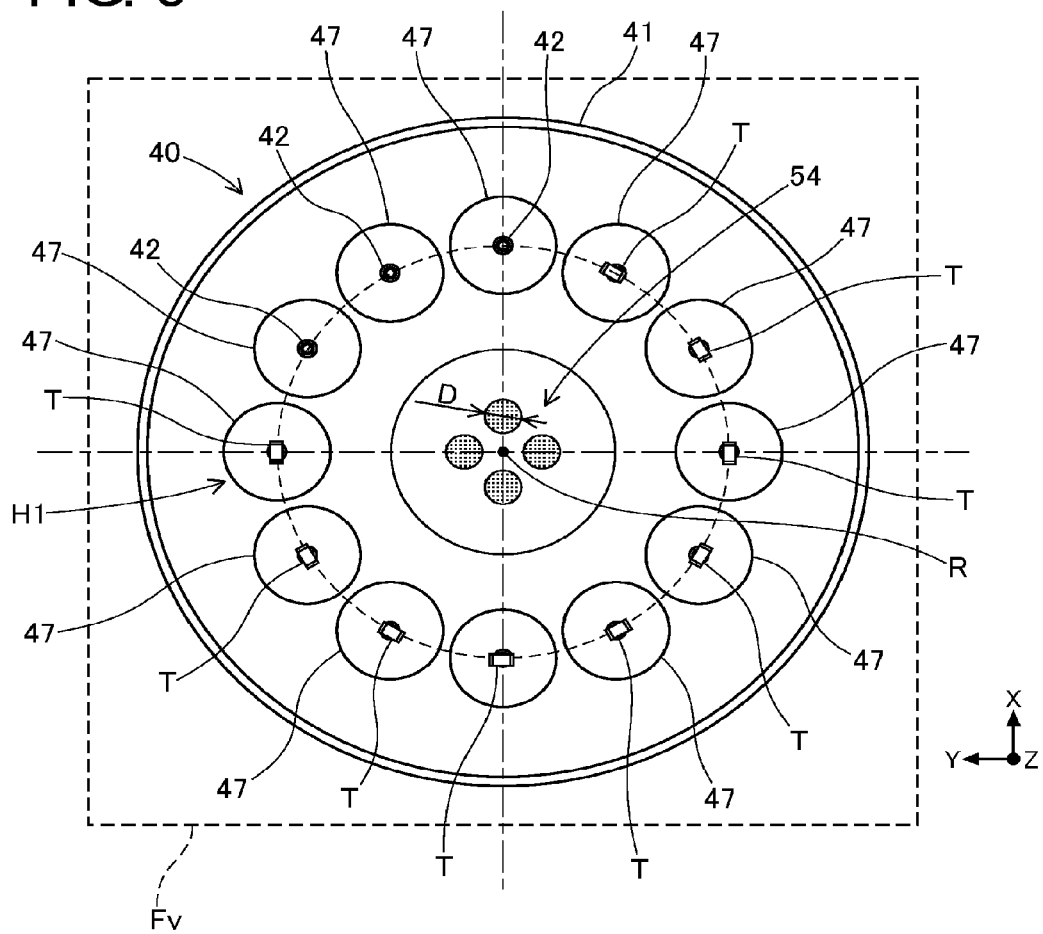
FIG. 3 is a view from an A direction arrow of FIG. 2.

As illustrated in FIG. 3, the nozzle holder 41 supports a plurality of (in the present embodiment, 12) nozzle spindles 47 to be capable of sliding in the Z-axis direction such that the nozzle spindles 47 are positioned at an equal interval in the circumferential direction on a circular circumference with the same center as the R-axis. As illustrated in FIG. 2, each of the suction nozzles 42 is attached to the bottom end portion of each of the nozzle spindles 47 in an exchangeable manner. In this manner, the nozzle holder 41 supports each of the suction nozzles 42 via each of the nozzle spindles 47.

A nozzle gear 47a is formed on the top end portion of the nozzle spindle 47. The nozzle gear 47a meshes with a θ-axis gear 51 which is supported to be capable of relative rotation on the outer circumferential side of the index shaft 46, and the e-axis gear 51 is capable of sliding in the Z-axis direction. The θ-axis gear 51 has a tooth width of a predetermined length in the Z-axis direction, is joined to a θ-axis motor which is not depicted in the drawings via a transmission mechanism 52, and is rotationally driven by the θ-axis motor. According to this configuration, when the θ-axis motor rotates, all of the nozzle spindles 47 which are supported by the nozzle holder 41 rotate via the transmission mechanism 52 and the θ-axis gear 51. Accordingly, each of the suction nozzles 42 turns in relation to the nozzle holder 41 due to the rotation of the θ-axis motor, and is configured to be rotationally controlled by the θ-axis motor or the like.

A compression spring 48 is provided on the outer circumferential side of the nozzle spindle 47 between the top face of the nozzle holder 41 and the bottom surface of the nozzle gear 47a. The nozzle spindle 47 is biased upward in relation to the nozzle holder 41 by the compression spring 48, and is restricted from moving upward due to a large diameter portion 47b which is formed on the bottom end portion abutting the bottom surface of the nozzle holder 41. In other words, a state in which the large diameter portion 47b of the nozzle spindle 47 abuts the nozzle holder 41 is a state in which the suction nozzle 42 which is attached to the nozzle spindle 47 is lifted to the greatest degree.

A nozzle lever 53 abuts the top end surface of the nozzle spindle 47 which is calculated to be in a lifting and lowering position H1 among the plurality of nozzle spindles 47. The nozzle lever 53 is joined to the output shaft of the Z-axis motor 45 via a ball screw mechanism which is not depicted in the drawings, and movement in the Z-axis direction is controlled by the rotational driving of the Z-axis motor 45. According to this configuration, when the Z-axis motor 45 rotates, the nozzle lever 53 presses the nozzle spindle 47 and the nozzle lever 43 causes the nozzle spindle 47 to be lowered in the Z-axis direction against the elastic force of the compression spring 48.

In this manner, the lifting and lowering mechanism is formed of the Z-axis motor 45, the compression spring 48, and the like, and the suction nozzle 42 is configured to be lifted and lowered with the movement of the nozzle spindle 47 in the Z-axis direction. A negative pressure is supplied to each of the suction nozzles 42 from a suction nozzle drive device which is not depicted in the drawings via the nozzle spindles 47. Accordingly, each of the suction nozzles 42 is capable of sucking the electronic component T using the tip portion.

Fiducial marks 54 are attached to the bottom surface of the nozzle holder 41 as illustrated in FIG. 3. When the component camera 61 which is described later images the electronic component T which is held by the suction nozzle 42, the fiducial marks 54 are attached to a defined position of the mounting head 40 which fits within the camera visual field Fv of the component camera 61. In the present embodiment, the fiducial marks 54 are disposed on the bottom surface of the nozzle holder 41 such that the center of the fiducial marks 54 matches the center of the R-axis. Accordingly, the fiducial marks 54 are configured to indicate a position which is a reference of the mounting head 40.

In the present embodiment, as illustrated in FIG. 3, the fiducial marks 54 are configured by disposing four circular portions which have a diameter D at an equal interval around the R-axis. The fiducial marks 54 are set to dimensions which occupy a defined area in the camera visual field Fv of the component camera 61 in a case in which the fiducial marks 54 are imaged by the component camera 61. Specifically, in the image data which is acquired by the imaging, the diameter D of the circular portions is set such that each of the four circular portions forming the fiducial marks 54 is depicted by a defined number of pixels. The hue of the fiducial marks 54 is set such that the boundary with the nozzle holder 41 is clear.

(1-1-4. Component Camera 61 and Board Camera 62)

The component camera 61 and the board camera 62 are digital imaging devices including an imaging element such as a CCD (Charge Coupled Device), a CMOS (Complementary Metal Oxide Semiconductor), or the like. The component camera 61 and the board camera 62 perform imaging of an area which fits within the camera visual field Fv based on a control signal by the control device 70 which is connected to be capable of communication, and transmit the image data which is acquired using the imaging to the control device 70.

The component camera 61 is fixed to the base 2 such that the optical axis is the Z-axis direction, and is configured to be capable of imaging the electronic component T which is in a state of being held by the suction nozzle 42. Specifically, the lens unit of the component camera 61 is set such that the focal point is on a target object positioned a fixed distance from the imaging element. As illustrated in FIG. 3, the camera visual field Fv of the lens unit of the component camera 61 is set to a size in which all of the suction nozzles 42 which are supported by the mounting head 40 fit within the camera visual field Fv. In other words, when performing imaging using the component camera 61 which is set to this camera visual field Fv, it is possible to fit all of the electronic components T which are held by the 12 suction nozzles 42 in a single item of image data.

The control device 70 which acquires the image data from the component camera 61 recognizes the holding state of the electronic component T by the suction nozzle 42 using image processing. The control device 70 is capable of obtaining an improvement in the precision of the mounting control by correcting the position and the angle of the suction nozzle 42 according to the holding state of the electronic component T. Detailed description of the recognition processing of the holding state of the electronic component T will be given later.

The board camera 62 is fixed to the moving table 34 such that the optical axis is the Z-axis direction, and is configured to be capable of imaging the circuit board B. The control device 70 which acquires the image data from the board camera 62 recognizes the positioning state of the circuit board B by the board conveyance device 10 by recognizing the board marks which are attached to the printed circuit board, for example, using image processing. The control device 70 performs control to correct the position of the moving table 34 according to the positioning state of the circuit board B, and to perform the mounting of the electronic component T. In this manner, by using the image data obtained through the imaging of the board camera 62, it becomes possible to obtain an improvement in the precision of the mounting control.

(1-1-5. Control Device 70)

Figure 4:
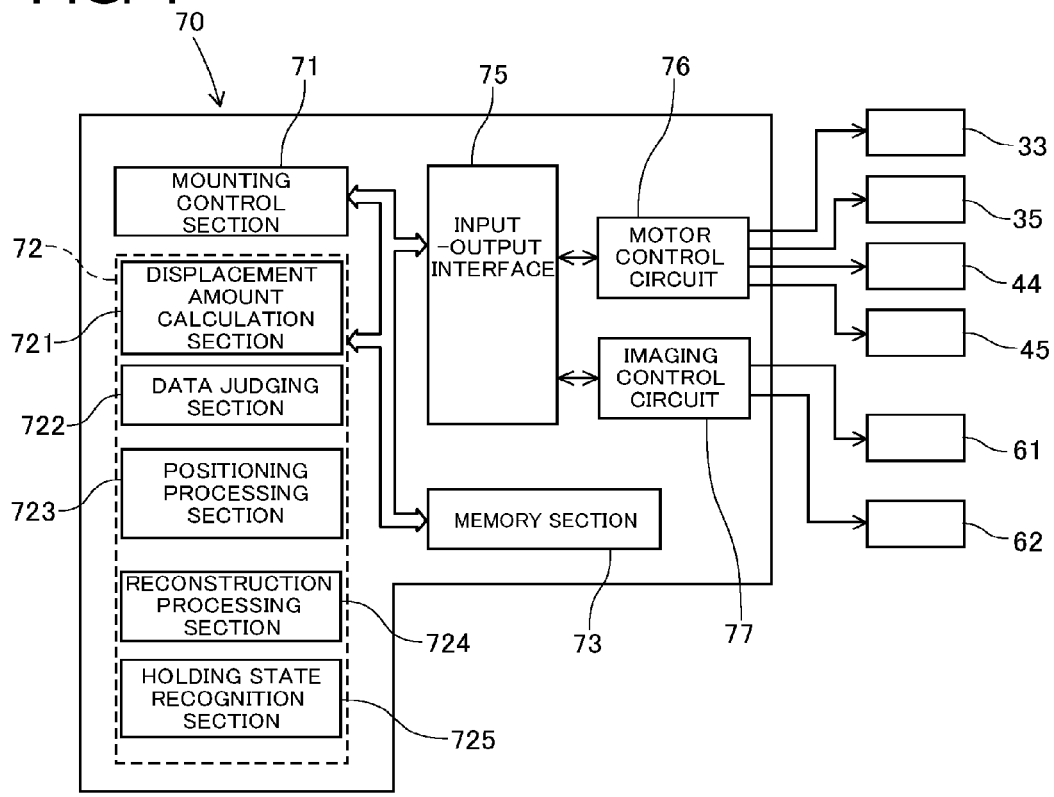
FIG. 4 is a block diagram illustrating a control device of the component mounting machine.

The control device 70 is mainly formed of a CPU, various memory, and a circuit board, and controls the mounting of the electronic components T onto the circuit board B based on the image data which is acquired by the imaging of the component camera 61 and the board camera 62. As illustrated in FIG. 4, in the control device 70, an input-output interface 75 is connected to amounting control section 71, an image processing section 72, and a memory section 73 via a bus. A motor control circuit 76 and an imaging control circuit 77 are connected to the input-output interface 75.

The mounting control section 71 controls the position of the mounting head 40 and the operations of the vacuum mechanism via the motor control circuit 76. More specifically, the mounting control section 71 receives input of information which is output from various sensors, of which a plurality are provided in the component mounting machine 1, and the results of the various recognition processing. The mounting control section 71 transmits a control signal to the motor control circuit 76 based on a control program which is stored in the memory section 73, information from the various sensors, and the results of the image processing and the recognition processing. Accordingly, the positions and the rotational angles of the suction nozzles 42 which are supported by the mounting head 40 are controlled.

The image processing section 72 acquires the image data obtained through the imaging of the component camera 61 and the board camera 62 via the imaging control circuit 77 and executes image processing corresponding to a use case. Examples of the image processing include binarization, filtering, hue extraction, super-resolution processing, and the like of the image data. Detailed description of the image processing section 72 will be given later.

The memory section 73 is formed of an optical drive device such as a hard disk device, or flash memory, or the like. A control program for operating the component mounting machine 1, image data which is transferred from the component camera 61 and the board camera 62 to the control device 70 via a bus or a communication cable, temporary data of the processing by the image processing section 72, and the like are stored in the memory section 73. The input-output interface 75 is interposed between the CPU or the memory section 73 and the control circuits 76 and 77, and adjusts the data format conversion and the signal strength.

The motor control circuit 76 controls the Y-axis motor 33, the X-axis motor 35, the R-axis motor 44, the Z-axis motor 45, and the θ-axis motor based on the control signals of the mounting control section 71. Accordingly, the mounting head 40 is positioned in each axial direction. According to this control, the predetermined suction nozzle 42 is positioned to be in the lifting and lowering position H1, and is controlled to be at a predetermined angle.

The imaging control circuit 77 controls the imaging by the component camera 61 and the board camera 62 based on the control signal of the imaging by the CPU or the like of the control device 70. The imaging control circuit 77 acquires the image data which is obtained through the imaging of the component camera 61 and the board camera 62, and causes the memory section 73 to store the image data via the input-output interface 75.

(1-2. Detailed Configuration of Image Processing Section 72)

Description will be given of the detailed configuration of the image processing section 72 of the control device 70. Here, a process in which the mounting control section 71 recognizes the holding state of the electronic component which is used when correcting the position and the angle of the suction nozzle 42 is included in the various image processing which is performed by the image processing section 72. The image data which is obtained through the imaging of the component camera 61 is used in the recognition processing of the holding state. Here, as described above, in the lens unit of the component camera 61, the focal length is set to be fixed, and the camera visual field is set in consideration of the area in which the plurality of suction nozzles 42 which are supported by the mounting head 40 are disposed.

Therefore, in the recognition processing of the holding state in which the small component is the target, if the acquired image data is simply used, the area which is occupied by the small component in the image data is small, and sufficient resolution may not be secured. Therefore, in the present embodiment, in a case in which the target of the mounting processing is the small component, in the image processing section 72, by performing the super-resolution processing, an improvement in the precision of the recognition processing of the holding state of the component is obtained. Plural types of processing method are known for the super-resolution processing; however, the image processing section 72 adopts the multi-frame type super-resolution processing.

Specifically, the image processing section 72 performs the super-resolution processing which uses a plurality of items of image data which are captured at imaging positions at which the relative positions of the component camera 61 to the electronic component T differ from each other. The image processing section 72 generates high resolution data using the multi-frame type super-resolution processing and recognizes the holding state of the electronic component T by the suction nozzle 42 based on the high resolution data. As illustrated in FIG. 4, the image processing section 72 includes a displacement amount calculation section 721, a data judging section 722, a positioning processing section 723, a reconstruction processing section 724, and a holding state recognition section 725.

The displacement amount calculation section 721 uses one item of image data among the plurality of items of image data as reference data, and calculates the displacement amount of the imaging position of each of the other items of image data in relation to the imaging position of the reference data. The "reference data" described above is selected arbitrarily from the plurality of items of image data which are acquired through the imaging of the component camera 61 when performing the multi-frame type super-resolution processing. For the reference data, for example, the image data which is acquired through the first imaging among the imaging which takes place over a plurality of times may be used as the reference data. Hereinafter, the other items of image data from the plurality of items of image data excluding the reference data are also referred to as "auxiliary data".

The displacement amount calculation section 721 calculates each displacement amount of the auxiliary data based on the fiducial marks 54 contained in each item of image data (the reference data and the auxiliary data). Here, as described above, when the component camera 61 images the electronic component T which is held by the suction nozzle 42, the fiducial marks 54 are attached to a defined position of the mounting head 40 which fits within the camera visual field Fv of the component camera 61. Accordingly, in a case in which the component camera 61 images the electronic component T which is held by the suction nozzle 42, the fiducial marks 54 are contained in each item of image data which is obtained through the imaging.

Specifically, the displacement amount calculation section 721 first recognizes the position of the fiducial marks 54 in the reference data. It is possible to recognize the position of the fiducial marks 54 by using the center of the reference data as the optical axis of the component camera 61 and calculating the distance from the optical axis. The displacement amount calculation section 721 similarly recognizes the position of the fiducial marks 54 in the auxiliary data. The displacement amount calculation section 721 calculates the displacement amount from the differences in the positions of the fiducial marks 54 in the reference data and the auxiliary data which are recognized.

The data judging section 722 determines the suitability of each item of image data in the super-resolution processing which uses the plurality of items of image data, that is, in the multi-frame type super-resolution processing. The data judging section 722 determines the suitability described above based on each of the displacement amounts of the plurality of items of image data, and the interval between the pixels in the imaging element of the component camera 61. Here, image data which is suitable for the multi-frame type super-resolution processing is image data in which $\Delta = Wp(M+1/N)$ is an optimum value, where the displacement amount is $\Delta$, the interval between the pixels is Wp, an arbitrary integer is M, and a number of frames in the movement direction (including the reference data) is N.

For example, in a case in which the integer M is 0, the movement direction is the X-axis direction, and the number N of frames is 2, auxiliary data in which the displacement amount $\Delta$ is shifted by half a pixel ($\Delta = Wp/2$) in the X-axis direction is determined to be suitable for the super-resolution processing. In a case in which the movement direction includes the Y-axis direction, each displacement amount of the movement directions is calculated, and determination is performed in the same manner as described above. In actuality, in consideration of an allowable error, the suitability is determined according to whether or not the displacement amount of the image data fits within a predetermined allowable range.

The positioning processing section 723 performs the positioning of the other items of image data (the auxiliary data) in relation to the reference data based on each displacement amount of the plurality of items of image data. In the positioning processing, a process is performed such that the fiducial marks 54 in the auxiliary data match the fiducial marks 54 in the reference data. Accordingly, in a case in which the movement of the imaging position of the auxiliary data includes movement in the X and Y axial directions or the rotational direction in relation to the imaging position of the reference data, the auxiliary data is positioned to the reference data so as to be moved in the opposite direction.

In the positioning processing, control instruction values are not used in the movement to the auxiliary data imaging position. Accordingly, even if movement in an unintended direction is included in the movement to the imaging position of the auxiliary data as a result of operational error or vibration of the movement mechanism (the mounting head 40), the configuration is such that the positioning is carried out including the movement and does not influence the subsequent image processing. The positioning processing may move the auxiliary data by the calculated displacement amount, and may simply cause the fiducial marks 54 to match each other. In either case, after being positioned, the plurality of items of image data are related to each calculated displacement amount.

The reconstruction processing section 724 generates the high resolution data based on the plurality of items of image data which are positioned. Specifically, the reconstruction processing section 724 reconstructs the image data with increased resolution using a Maximum A Posterior (MAP) method, an Iterative Back Projection (IBP) method, or the like based on the plurality of items of image data and the displacement amounts related to each thereof.

The holding state recognition section 725 recognizes the holding state including the position and the angle of the electronic component T which is held by the suction nozzle 42 which is the holding member based on the high resolution data which is generated by the reconstruction processing section 724. The holding state of the electronic component T is recognized with higher precision to the extent that the resolution is increased in comparison with a holding state which is recognized using the low resolution data which is acquired through the imaging of the component camera 61.

Here, when the area occupied by the electronic component T which is the target of the recognition of the holding state in the image data is small, the recognition precision is reduced. This is because, when the number of pixels which are used for indicating one side of the electronic component T, for example, drops below a predetermined number of pixels, it becomes difficult to calculate the length and the angle of the side. Therefore, the high resolution data in which one side of the electronic component T is depicted using a predetermined number of pixels is generated using the super-resolution processing, and uses the super-resolution processing in the recognition of the holding state.

Accordingly, the image processing section 72 recognizes the holding state including the position of the electronic component T in the X-axis direction and the Y-axis direction in relation to the suction nozzle 42, and the rotational angle of the electronic component T in relation to the center axis of the suction nozzle 42. The image processing section 72 repeats a similar processing by the number of the plurality of electronic components T which are held by the plurality of suction nozzles 42 which are supported by the mounting head 40. The image processing section 72 stores the holding state of each of the electronic components T in the memory section 73.

(1-3. Mounting Control and the Like of Electronic Component T by Component Mounting Machine)
(1-3-1. Mounting Control of Electronic Component T)

Figure 5:
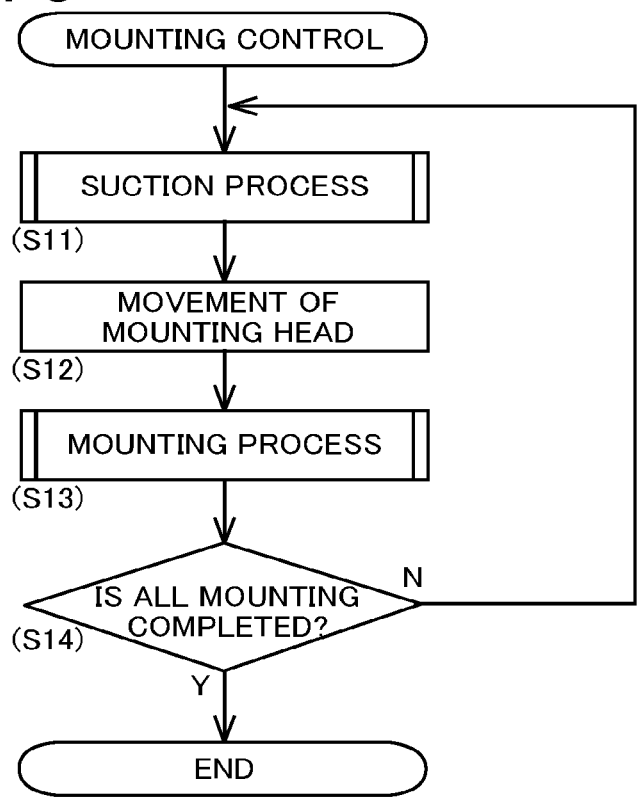
FIG. 5 is a flowchart illustrating a mounting processing by the component mounting machine.

Description will be given of the mounting control of the electronic components T by the component mounting machine 1 described above, with reference to FIG. 5. The recognition processing of the holding state is executed in the mounting control of the electronic components T by the mounting control section 71. As illustrated in FIG. 5, in the mounting control, first, a suction processing (step 11 (hereinafter, "step" will be denoted as "S")) in which the electronic components T are sequentially sucked by the plurality of suction nozzles 42 is executed.

Next, the mounting head 40 is moved to above the mounting position on the circuit board B (S12). At this time, the mounting head 40 passes over the component camera 61, and the imaging process of the electronic components T by the component camera 61 is executed at this time. Subsequently, a mounting processing (S13) in which the electronic components T are sequentially mounted onto the circuit board B is executed. It is determined whether or not the mounting of all of the electronic components T is completed (S14), and the processes described above (S11 to S14) are repeated until the mounting is completed.

In the moving (S12) and the mounting process (S13) of the mounting head 40 described above, the recognition processing of the holding state of the electronic components T is executed based on the image data obtained through the imaging of the component camera 61. The mounting control section 71 corrects the positions and the angles of the suction nozzles 42 based on the holding state of the electronic components T by each of the suction nozzles 42 and controls the mounting of the electronic components T.

(1-3-2. Recognition Processing of Holding State of Electronic Component T)

Description will be given of the recognition processing of the holding state of the electronic component T described above with reference to FIGS. 6 and 7. Here, the recognition processing of the holding state is used in the high resolution data which is generated using the super-resolution processing. The super-resolution processing adopts a multi-frame type processing using a plurality of items of image data. In the present embodiment, the super-resolution processing is performed using four items of image data which are captured at four imaging positions in which the relative positions of the component camera 61 to the electronic component Tare different from each other.

Figure 6:
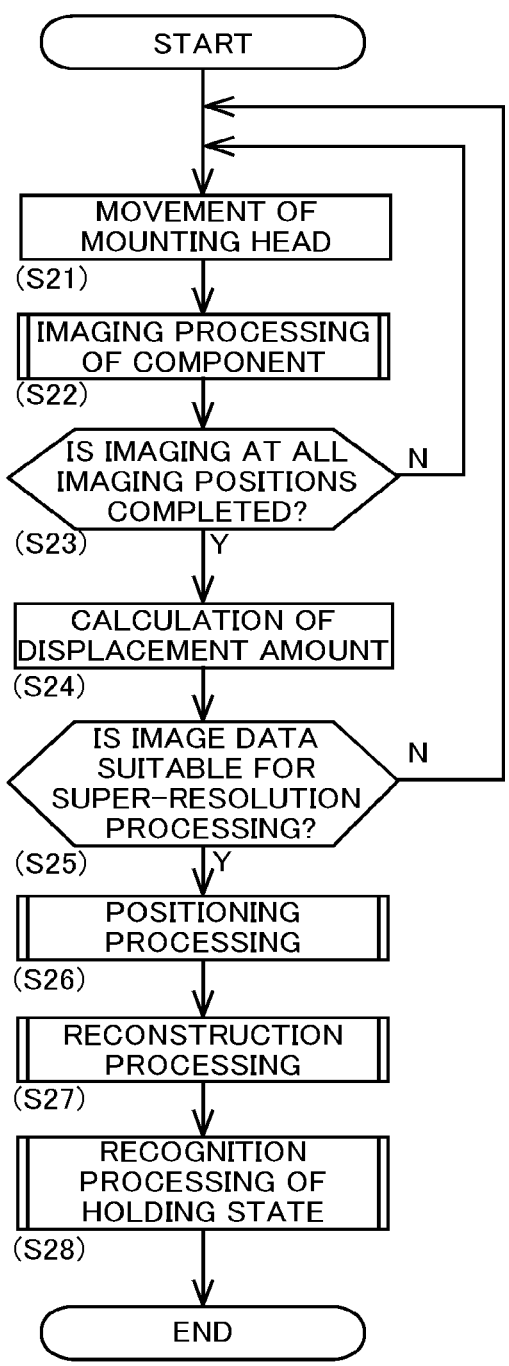
FIG. 6 is a flowchart illustrating a recognition processing of a holding state.

As illustrated in FIG. 6, the control device 70 moves the mounting head 40 to the first imaging position (S21). An example of the first imaging position is a position at which the optical axis of the component camera 61 matches the center of the fiducial marks 54 which are attached to the mounting head 40. The control device 70 performs the imaging processing of the plurality of electronic components T (S22).

Specifically, the control device 70 inputs the fact that the suction nozzles 42 which are supported by the mounting head 40 are above the component camera 61 using the motor control circuit 76, and transmits a control instruction to the component camera 61 via the imaging control circuit 77 indicating that the imaging is to be performed. Accordingly, all of the electronic components T in the state of being held by the plurality of suction nozzles 42 are imaged, and the image data obtained through the imaging is stored in the memory section 73.

Next, the control device 70 determines whether or not the imaging at the four imaging positions is completed (S23), and in a case in which the imaging is not completed (S23: No), the control device 70 repeats S21 to S23. When moving the mounting head 40 again, the control device 70 moves the mounting head 40 in the X-axis direction or the Y-axis direction by a distance corresponding to half of the interval between the pixels in the imaging element (S21). The control device 70 performs the imaging processing of the electronic component T which is moved by half a pixel again (S22).

When the imaging at all of the imaging positions is completed (S23: Yes), in addition to the image data which is obtained through the first imaging process, image data which is shifted by half a pixel in the X-axis direction, imaging position which is shifted by half a pixel in the Y-axis direction, and imaging position which is shifted by half a pixel in each of the X-axis direction and the Y-axis direction are stored in the memory section 73.

Figure 7:
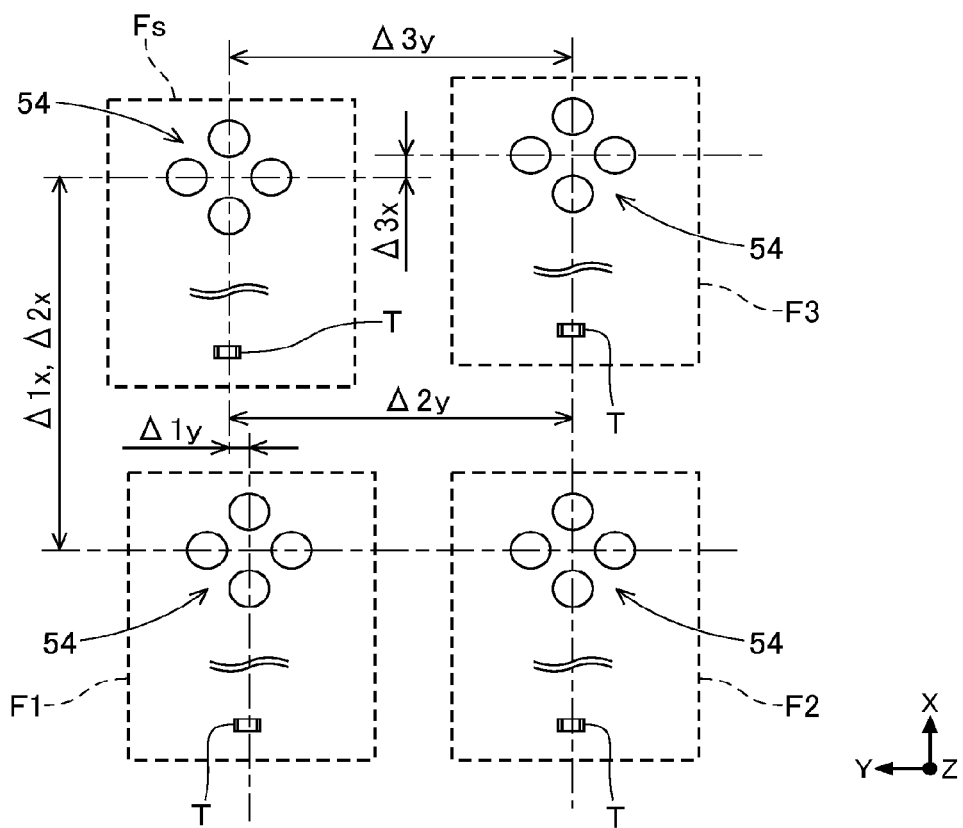
FIG. 7 is a diagram illustrating a displacement amount of an imaging position in a plurality of items of image data.

Next, the displacement amount calculation section 721 calculates the displacement amount of the other items of auxiliary data using the image data which is acquired through the first imaging as the reference data (S24). Here, FIG. 7 illustrates the displacement amount of the imaging positions of a plurality of items of image data. Note that, Fs of FIG. 7 indicates the portion of the reference data, and F1 to F3 indicate the portion of the other items of auxiliary data. The displacement amount calculation section 721 first recognizes the fiducial marks 54 contained in the reference data Fs and in each item of auxiliary data F1 to F3.

Next, the displacement amount calculation section 721 sets the displacement amount of the reference data Fs to 0 and calculates the displacement amount ($\Delta 1x$, $\Delta 1y$) of the first auxiliary data F1 in relation to the imaging position of the reference data Fs. The displacement amount calculation section 721 calculates the displacement amount ($\Delta 2x$, $\Delta 2y$) of the second auxiliary data F2, and the displacement amount ($\Delta 3x$, $\Delta 3y$) of the third auxiliary data F3 in the same manner.

The data judging section 722 determines whether or not the plurality of items of image data are suitable for the multi-frame type super-resolution processing (S25). Specifically, the data judging section 722 first acquires the displacement amounts Δ1 to Δ3 of the items of auxiliary data F1 to F3. Next, the data judging section 722 determines the suitability of each of the displacement amounts Δ1 to Δ3 based on the allowable range and the corresponding direction of movement.

Specifically, it is determined whether an X-axis direction component Δ1x in the displacement amount Δ1 of the first auxiliary data F1 fits in a range obtained by adding and subtracting an allowable error in relation to half of the interval Wp between the pixels of the imaging element according to the movement (S21) of the mounting head 40. Furthermore, it is determined whether a Y-axis direction component Δ1y in the displacement amount Δ1 fits in a range obtained by adding and subtracting an allowable error in relation to the Y-axis direction position of the reference data. The data judging section 722 performs the determination in the same manner for the displacement amounts Δ2 and Δ3.

In the determination described above, in a case in which the displacement amounts Δ1 to Δ3 of the auxiliary data are determined to be unsuitable for the super-resolution processing (S25: No), the control device 70 performs the imaging again. In other words, the control device 70 moves the mounting head 40 to the imaging position corresponding to the auxiliary data which is determined to be unsuitable (S21) and performs the imaging processing of the electronic component T (S22). S21 to S23 are repeated by the number of items of auxiliary data which are determined to be unsuitable.

Meanwhile, in a case in which the displacement amounts Δ1 to Δ3 of the displacement amounts of the auxiliary data are determined to be suitable for the super-resolution processing (S25: Yes), the positioning processing section 723 executes the positioning processing of the auxiliary data in relation to the reference data (S26). In this positioning process, processing is performed so as to cause the fiducial marks 54 in the auxiliary data to match the fiducial marks 54 in the reference data based on the displacement amounts Δ1 to Δ3 of the auxiliary data. Accordingly, the auxiliary data is positioned to the reference data, related to the calculated displacement amounts Δ1 to Δ3 and stored in the memory section 73.

Next, the reconstruction processing section 724 executes the reconstruction processing in which the high resolution data is generated based on the plurality of items of image data which are positioned (S27). The positioning processing (S26) and the reconstruction processing (S27) which are described above correspond to the multi-frame type super-resolution processing. In this super-resolution processing, the image processing section 72 acquires high resolution data in which one side of the plurality of electronic components T is depicted using a predetermined number of pixels.

The holding state recognition section 725 executes a recognition processing of the holding state including the position and the angle of the electronic component T which is held by the suction nozzle 42 based on the high resolution data which is generated in the super-resolution processing (S28). The recognition processing of the holding state is performed by matching the electronic component T in the high resolution data to the external shape of the electronic component T contained in the component information, for example. The image processing section 72 causes the memory section 73 to store the shifting amount in the X-axis direction and in the Y-axis direction of the electronic component T in relation to each of the suction nozzles 42, and the rotational angle of the electronic component T in relation to the center axis of the suction nozzle 42 as the holding state of the electronic component T, and completes the recognition processing of the holding state.

(1-4. Effects of Configuration of Embodiment)

An assembling machine (the component mounting machine 1) according to the present embodiment is provided with a holding member (the suction nozzle 42) which acquires and holds a component (the electronic component T) which is supplied to the supply position Ps, a moving head (the mounting head 40) which supports one or a plurality of the holding members (the suction nozzles 42) to be capable of lifting and lowering the holding member and which is capable of moving from the supply position Ps to an assembling position (the mounting position Pf) at which an assembly (the circuit board B) is positioned, an imaging device (the component camera 61) which images the component which is held by the holding member, the fiducial marks 54 which are attached to a defined position of the moving head and which fit within a visual field (the camera visual field Fv) of the imaging device when the imaging device images the component, the image processing section 72 which generates high resolution data using super-resolution processing which uses a plurality of items of image data which are captured at imaging positions at which relative positions of the imaging device to the component differ from each other and recognizes a holding state of the component by the holding member based on the high resolution data, and the control device 70 which transfers the component to the assembling position by controlling movement of the holding member based on a control program which is stored in advance and the holding state of the component which is recognized. The fiducial marks 54 are set to dimensions that occupy a defined area in the visual field of the imaging device in a case in which the fiducial marks 54 are imaged by the imaging device. The image processing section 72 includes the displacement amount calculation section 721 which uses one item of the image data among the plurality of items of image data as reference data and calculates the displacement amounts Δ1 to Δ3 of the imaging positions of the other items of image data in relation to the imaging position of the reference data based on the fiducial marks 54 included in each item of the image data, the positioning processing section 723 which performs the positioning of the other items of image data in relation to the reference data based on the displacement amounts Δ1 to Δ3 of the plurality of items of image data, and the reconstruction processing section 724 which generates the high resolution data based on the plurality of items of image data which are positioned.

In this configuration, the displacement amount calculation section 721 calculates the displacement amounts Δ1 to Δ3 of the auxiliary data based on the fiducial marks 54 included in the reference data and the auxiliary data. Therefore, even if, hypothetically, an error arises between the instructed position and the actual position when the electronic component T is moved relative to the component camera 61, it is possible to prevent the error from influencing the positioning processing (S26). In other words, the positioning processing section 723 performs the positioning processing of the image data without using the instructed position to the mounting head 40 when the electronic component T is moved. Accordingly, the positioning processing section 723 becomes capable of accurately positioning each item of the image data.

Accordingly, with regard to the lens unit of the component camera 61, even if the camera visual field Fv is set such that the large component fits therein, the image processing section 72 is capable of generating high resolution data sufficient for the recognition of the holding state of the small electronic component T without using a high resolution imaging element. Therefore, the control device 70 of the component mounting machine 1 is capable of acquiring the image data which is used in the recognition of the holding state corresponding to various electronic components T by using the high resolution data which is generated in this manner, and it is possible to improve the precision of the assembly control (the mounting control).

In the present embodiment, the image processing section further includes the data judging section 722 which determines suitability of each item of the image data in the super-resolution processing based on each displacement amount Δ1 to Δ3 of the plurality of items of image data and an interval between pixels in the imaging element of the imaging device (the component camera 61).

According to this configuration, it is possible to determine the suitability of the image data which is acquired through the imaging in the super-resolution processing (S25). Therefore, since it is possible to recognize the unsuitable image data before the execution of the super-resolution processing (S26, S27), it is possible to prevent, beforehand, a reduction in the precision of the super-resolution processing. In a case in which image data which is unsuitable for the super-resolution processing is detected, by performing re-imaging (S21 to S23), it is possible to acquire image data which is suitable for the super-resolution processing again.

In the present embodiment, the moving head (the mounting head 40) supports a plurality of the holding members (the suction nozzles 42) using a holder member (the nozzle holder 41) capable of rotating, and the visual field (the camera visual field Fv) of the imaging device (the component camera 61) is set to a size within which all of the holding members which are supported by the moving head fit.

According to this configuration, even if the lens unit is set to have a wide camera visual field Fv, the image processing section 72 becomes capable of recognizing the holding state corresponding to a minute electronic component T. Accordingly, in the component mounting machine 1, it becomes possible to support various electronic components T. Accordingly, the present disclosure is of particular use for application to the component mounting machine 1.

In the present embodiment, the holding member is the suction nozzle 42 which sucks the component (the electronic component T) and holds the component, and the assembling machine is the component mounting machine 1 which mounts the component which is held by the suction nozzle to a circuit board which is the assembly (the circuit board B) through control of the control device 70.

According to this configuration, in the component mounting machine 1 in which, in addition to the miniaturization of the electronic components T, there is demand to mount the large electronic components T onto the circuit board B, it is possible to adopt a wide-angle lens unit, and it becomes possible to support the minute electronic components T. Accordingly, the present disclosure is of particular use for application to the component mounting machine 1.

Second Embodiment

Figure 8:
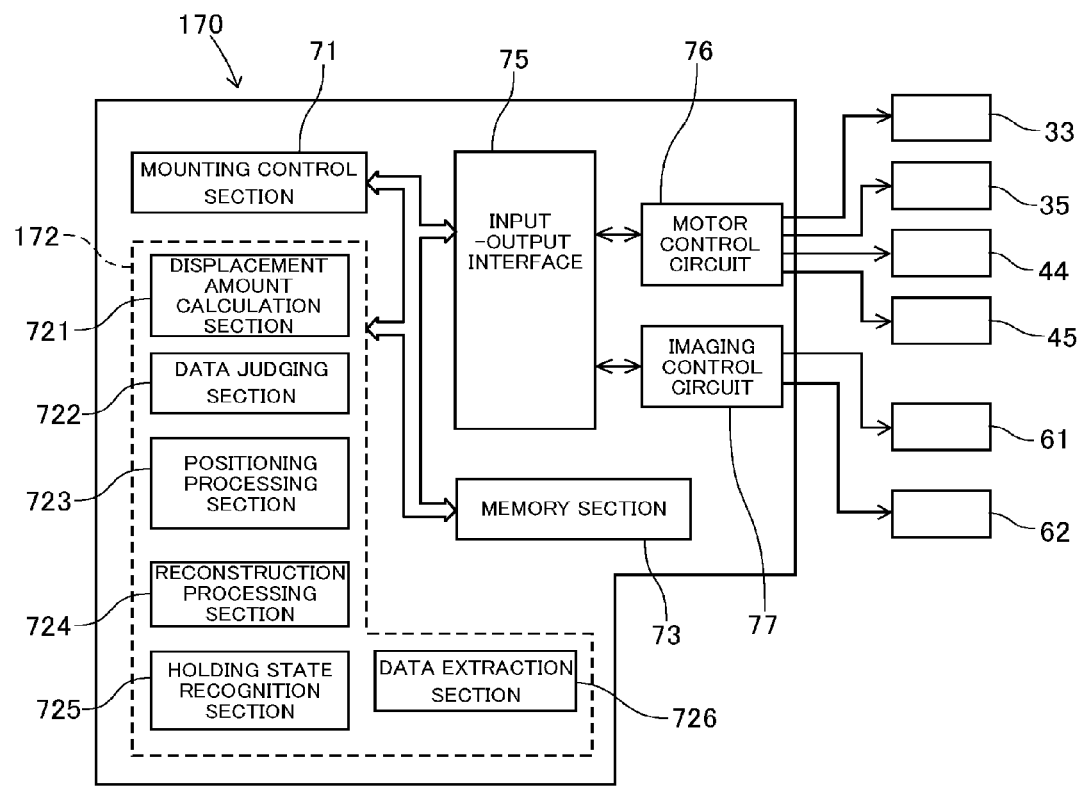
FIG. 8 is a block diagram illustrating a control device of a component mounting machine in a second embodiment.
Figure 9:
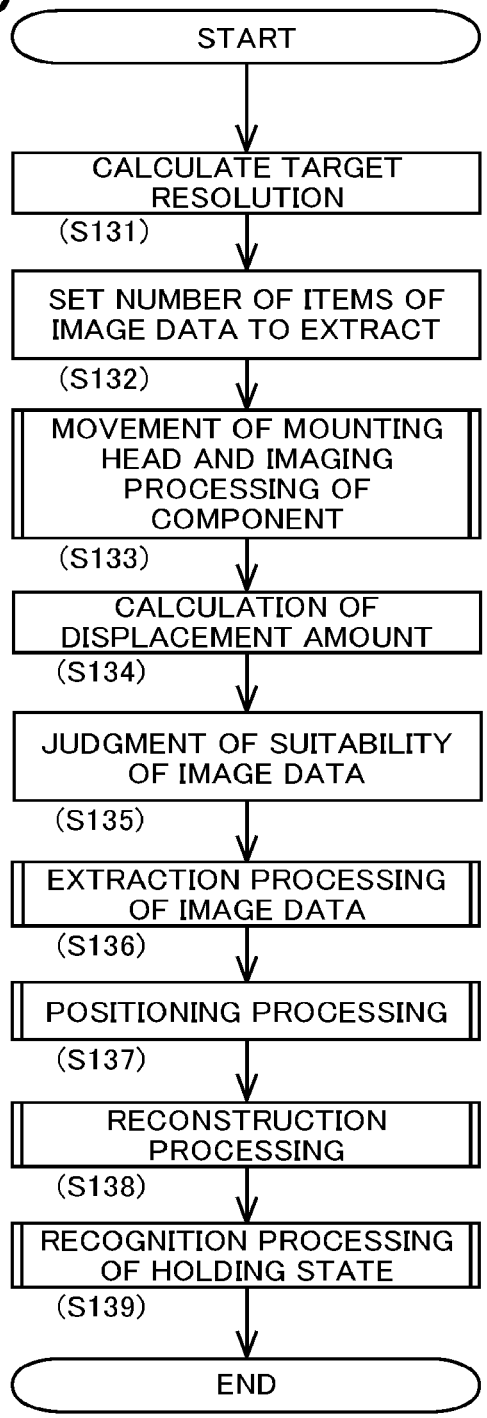
FIG. 9 is a flowchart illustrating a recognition processing of a holding state.

Description will be given of the component mounting machine of the second embodiment, with reference to FIGS. 8 and 9. The configuration of the second embodiment mainly differs in the configuration of the image processing section 72 in the control device 70 of the first embodiment and the recognition processing of the holding state of the electronic component T. Since other common elements are substantially the same as in the first embodiment, detailed description thereof will be omitted. Hereinafter, description will be given of only the differing points.

(2-1. Control Device 170)

In the control device 170 of the present embodiment, the method of acquiring the plurality of items of image data used in the super-resolution processing differs from the method adopted in the control device 70 of the first embodiment. Specifically, in the imaging processing for acquiring the plurality of items of image data used in the super-resolution processing, the control device 170 controls the component camera 61 to perform imaging of the electronic component T over a plurality of times while causing the mounting head 40 to move relative to the component camera 61. The number of items of the image data which are acquired through the imaging control is greater than the number of items of the image data which are used in the super-resolution processing.

The displacement amount calculation section 721 uses one item of image data among the plurality of items of image data which are acquired as reference data, and calculates the displacement amount of the imaging position of each of the other items of image data (the auxiliary data) in relation to the imaging position of the reference data. The data judging section 722 determines the suitability of the image data in the super-resolution processing based on the displacement amounts which are calculated by the displacement amount calculation section 721 for each of the plurality of items of image data which are acquired through the control of the imaging, as described above.

The image processing section 172 of the control device 170 includes a data extraction section 726 in addition to the image processing section 72 of the first embodiment. The data extraction section 726 extracts a predetermined number of items of image data used in the super-resolution processing from the plurality of items of image data which are acquired through the control of the imaging based on the determination results of the data judging section 722. At this time, the data extraction section 726 first calculates the target resolution in the high resolution data corresponding to the dimension information of the electronic component T which is held by the suction nozzle 42 and the number of pixels in the imaging element of the component camera 61. Next, the data extraction section 726 sets the number of items of image data to be extracted based on the target resolution.

Here, according to the configuration of the component mounting machine 1 described above, a substantially fixed distance is maintained for the distance from the component camera 61 to the mounting head 40. The lens unit of the component camera 61 has a fixed focal point and a substantially fixed camera visual field Fv is maintained. Therefore, when the electronic component T which is the target object is imaged by the component camera 61 which includes an imaging element formed of a defined number of pixels, the number of pixels which are occupied by the electronic component T in the image data is determined.

As described above, when the number of pixels used for depicting one side of the electronic component T in the image data falls below a predetermined number of pixels, it becomes difficult to calculate the length and the angle of the side. In other words, in order to recognize the length and the angle of one side of the electronic component T, the target resolution may be set such that the number of pixels used for depicting the one side exceeds the predetermined number of pixels.

Therefore, the data extraction section 726 calculates the target resolution corresponding to the dimension information of the electronic component T and the number of pixels in the imaging element of the component camera 61. In other words, the target resolution fluctuates, as appropriate, according to the dimensions of the electronic component T and the number of pixels in the imaging element in the imaging environment which is determined by the distance from the component camera 61 to the electronic component T and the camera visual field Fv of the component camera 61.

Accordingly, if the dimensions of the electronic component T become smaller, the target resolution increases, and if the dimensions of the electronic component T become larger, the target resolution decreases. When the target resolution is set, the number of items of image data which are necessary in the multi-frame type super-resolution processing is determined. Therefore, the data extraction section 726 sets the number of items of image data to be extracted from the multiple items of image data which images when the control device 170 causes the mounting head 40 to move relative to the component camera 61 based on the target resolution.

The predetermined number of items of image data which are extracted are subjected to the super-resolution processing and high resolution data which satisfies the target resolution is generated by the positioning processing section 723 and the reconstruction processing section 724. The holding state recognition section performs a processing of recognizing the holding state of the electronic component T by the suction nozzle 42 based on the high resolution data. At this time, the number of pixels which are occupied by the electronic component T in the high resolution data is secured to some degree, and a prevention of a reduction in the recognition precision is obtained.

(2-2. Recognition Processing of Holding State of Electronic Component T)

Description will be given of the recognition processing of the holding state of the electronic component T in the present embodiment with reference to FIG. 9. The data extraction section 726 of the control device 170 acquires the dimension information relating to the electronic component T which is currently held by the suction nozzle 42 from the memory section 73. The data extraction section 726 calculates the target resolution corresponding to the dimension information and the number of pixels in the imaging element (S131).

Next, the data extraction section 726 sets the number of items of image data to be extracted for the super-resolution processing from the multiple items of image data which are acquired through the subsequent imaging processing based on the target resolution (S132). The number of items of image data to be extracted may be set for each movement direction of the electronic component T in relation to the component camera 61. For example, it is conceivable to set the number of items of image data to be extracted using a sum of the number of frames in the X-axis direction and the number of frames in the Y-axis direction.

Next, the control device 170 moves the mounting head 40 such that the mounting head 40 passes over the component camera 61. At this time, the control device 170 controls the component camera 61 to perform the imaging of the electronic component T over a plurality of times (S133). Specifically, the control device 170 transmits the imaging instruction to the component camera 61 at a predetermined timing over a plurality of times in a state in which the fiducial marks 54 fit within the camera visual field Fv of the component camera 61.

The movement direction and the movement speed of the mounting head 40, the timing of the imaging by the component camera 61, and the number of times imaging is performed, which are controlled by the control device 170, are determined by relationships with the number of items of image data to be extracted which is set by the data extraction section 726. For example, in a case in which the number of frames in the X-axis direction is 2, an imaging instruction is transmitted such that, in a state in which the mounting head 40 is moved at a fixed speed in the X-axis direction, the interval (the displacement amount $\Delta$) between each of the imaging positions becomes a value ($\Delta$=Wp (M+½)) obtained by adding a distance (Wp/3), which is obtained by halving the interval Wp between the pixels, to a value, which is obtained by multiplying the interval Wp between the pixels by the integer M.

According to the imaging processing described above, multiple items of image data are stored in the memory section 73 in a period during which the mounting head 40 is positioned above the component camera 61. Next, the displacement amount calculation section 721 calculates the displacement amount of the other items of auxiliary data using one item of the image data of the multiple items of image data as the reference data (S134). Since the calculation of the displacement amount (S134) is substantially the same as the calculation of the displacement amount in the first embodiment (S24), description thereof will be omitted.

The data judging section 722 determines (S135) the suitability in the super-resolution processing based on the displacement amounts which are calculated by the displacement amount calculation section 721 for each of the plurality of items of image data which are acquired through the control (S133) of the imaging, as described above. Specifically, the data judging section 722 determines the suitability based on the movement direction corresponding to the displacement amount and the allowable range based on the displacement amount of the auxiliary data and the number of items of the image data which are set in S132 to be extracted.

The data extraction section 726 extracts (S136) a predetermined number of items of image data used in the super-resolution processing from the plurality of items of image data which are acquired through the control (S133) of the imaging based on the determination results of the data judging section 722. The predetermined number of items of image data to be extracted is the number of items of image data to be extracted which is set in S132. In a case in which there are multiple items of image data suitable for the super-resolution processing in relation to the number of items of image data to be extracted, the items of image data of a higher order close to the optimal value are extracted with priority therefrom.

Subsequently, the positioning processing (S137), the reconstruction processing (S138), and the recognition processing of the holding state (S139) are executed. Since these processes are substantially the same as the corresponding processes (S26 to S28) in the first embodiment, detailed description thereof will be omitted. The image processing section 172 causes the memory section 73 to store the holding state of the plurality of electronic components T which are recognized, and completes the recognition processing of the holding state.

(2-3. Effects of Configuration of Embodiment)

According to the component mounting machine 1 described above, the same effects are obtained as in the first embodiment. In the present embodiment, the control device 170 controls the imaging device to perform imaging of the component (the electronic component T) over a plurality of times while causing the moving head (the mounting head 40) to move relative to the imaging device (the component camera 61), the data judging section 722 determines suitability in the super-resolution processing based on the displacement amounts $\Delta1$ to $\Delta3$ which are calculated by the displacement amount calculation section 721 for the plurality of items of image data which are acquired through control of the imaging, and the image processing section further includes the data extraction section 726 which extracts a predetermined number of items of the image data used in the super-resolution processing from the plurality of items of image data which are acquired through control of the imaging based on determination results of the data judging section 722.

According to this configuration, in the imaging processing (S133), it is possible to acquire image data which is suitable for the super-resolution processing by generally controlling the relative position of the electronic component T and the component camera 61, that is, the imaging position. Accordingly, it is possible to reduce the load of the imaging process, and to shorten the time necessary for the imaging process.

In the present embodiment, the data extraction section 726 calculates a target resolution in the high resolution data corresponding to dimension information of the component (the electronic component T) which is held by the holding member (the suction nozzle 42) and a number of pixels of the imaging element, and sets a number of items of the image data to be extracted based on the target resolution.

According to this configuration, when extracting the image data used in the super-resolution processing from the multiple items of image data, it is possible to set the number of items of image data to be extracted from the relationship with the target resolution. Accordingly, it is possible to prevent high resolution data with an excessively high resolution from being generated. Accordingly, it is possible to improve the efficiency of the super-resolution processing, and to reduce the processing load.

Modification Examples of First and Second Embodiments

In the first and second embodiments, as illustrated in FIG. 3, the fiducial marks 54 are formed by arranging four circular portions around the R-axis at an equal interval. With regard to this, if the fiducial marks 54 are set to dimensions which occupy a defined area in the camera visual field Fv of the component camera 61 in a case in which the fiducial marks 54 are imaged by the component camera 61, it is possible to set the shape and color as appropriate.

Specifically, in consideration of the direction of the relative movement of the electronic component T in relation to the component camera 61, a shape may be adopted in which there are a plurality of line portions that orthogonally intersect the direction. In a case in which rotational movement is included in the relative movement described above, it is conceivable to set the interval between the four circular portions to be great in order to suppress the angular error in the positioning process.

Here, in the imaging processing (S22) of the first embodiment, the imaging is performed with the electronic component T in a state of being positioned in relation to the component camera 61. Meanwhile, in the imaging processing (S133) of the second embodiment, the imaging is performed with the electronic component T in a state of movement in relation to the component camera 61. In addition, the imaging processing may be performed combining these.

For example, the imaging processing may be performed using the vibration or the like which occurs together with the movement of the mounting head 40. In a case in which the electronic component T is positioned in relation to the component camera 61, the mounting head 40 vibrates directly after the mounting head 40 reaches the instructed position, and there is a period until the mounting head 40 enters a completely still state. This occurs particularly easily in a case in which the movement speed of the mounting head 40 is high. Therefore, it is possible to image the electronic component T over a plurality of times in the period during which the mounting head 40 is vibrating and to extract the image data which is suitable for the super-resolution processing.

In the present embodiment, description is given exemplifying a configuration in which the assembling machine is the component mounting machine 1. In addition, if the assembling machine transfers a component which is acquired at a supply position to an assembling position and attaches the component to an assembly, it is possible to perform assembly control based on the holding state of the component which is recognized using the super-resolution processing. Accordingly, the assembling machine may form manufacturing equipment which assembles a power module or the like, for example. It is possible to obtain the same effects as the present embodiment even with this configuration.

REFERENCE SIGNS LIST

1: component mounting machine (assembling machine), 2: base, 10: board conveyance device, 20: component supply device, 30: component transfer device, 40: mounting head (moving head), 41: nozzle holder (holder member), 42: suction nozzle (holding member), 54: fiducial marks, 61: component camera (imaging device), 62: board camera, 70, 170: control device, 72, 172: image processing section, 721: displacement amount calculation section, 722: data judging section, 723: positioning processing section, 724: reconstruction processing section, 725: holding state recognition section, 726: data extraction section, B: circuit board (assembly), T: electronic component, Ps: supply position, Pf: mounting position (assembling position), Fs: reference data portion, F1 to F3: auxiliary data portion, $\Delta1$ to $\Delta3$: displacement amount, D: diameter of circular portion, Fv: camera visual field

The invention claimed is:

1. An assembling machine comprising:
   a holding member which acquires and holds a component which is supplied to a supply position;
   a moving head which supports one or a plurality of the holding members to be capable of lifting and lowering the holding member and which is capable of moving from the supply position to an assembling position at which an assembly is positioned;
   an imaging device which images the component which is held by the holding member;
   fiducial marks which are attached to a defined position of the moving head and which fit within a visual field of the imaging device when the imaging device images the component;

an image processing section which generates high resolution data using super-resolution processing which uses a plurality of items of image data which are captured at imaging positions at which relative positions of the imaging device to the component differ from each other and recognizes a holding state of the component by the holding member based on the high resolution data; and a control device which transfers the component to the assembling position by controlling movement of the holding member based on a control program which is stored in advance and the holding state of the component which is recognized, wherein the fiducial marks are set to dimensions that occupy a defined area in the visual field of the imaging device in a case in which the fiducial marks are imaged by the imaging device, and wherein the image processing section includes a displacement amount calculation section which uses one item of the image data among the plurality of items of image data as reference data and calculates each displacement amount of the imaging positions of the other items of image data in relation to the imaging position of the reference data based on the fiducial marks included in each item of the image data, a positioning processing section which performs the positioning of the other items of image data in relation to the reference data based on each of the displacement amounts of the plurality of items of image data, and a reconstruction processing section which generates the high resolution data based on the plurality of items of image data which are positioned.

2. The assembling machine according to claim 1, wherein the image processing section further includes a data judging section which determines suitability of each item of the image data in the super-resolution processing based on each displacement amount of the plurality of items of image data and an interval between pixels in an imaging element of the imaging device.

3. The assembling machine according to claim 2, wherein the control device controls the imaging device to perform imaging of the component over a plurality of times while causing the moving head to move relative to the imaging device, wherein the data judging section determines suitability in the super-resolution processing based on each of the displacement amounts which are calculated by the displacement amount calculation section for the plurality of items of image data which are acquired through control of the imaging, and wherein the image processing section further includes a data extraction section which extracts a predetermined number of items of the image data used in the super-resolution processing from the plurality of items of image data which are acquired through control of the imaging based on determination results of the data judging section.

4. The assembling machine according to claim 3, wherein the data extraction section calculates a target resolution in the high resolution data corresponding to dimension information of the component which is held by the holding member and a number of pixels of the imaging element, and sets a number of items of the image data to be extracted based on the target resolution.

5. The assembling machine according to claim 1, wherein the moving head supports a plurality of the holding members using a holder member capable of rotating, and wherein the visual field of the imaging device is set to a size within which all of the holding members which are supported by the moving head fit.

6. The assembling machine according to claim 1, wherein the holding member is a suction nozzle which sucks and holds the component, and wherein the assembling machine is a component mounting machine which mounts the component which is held by the suction nozzle to a circuit board which is the assembly through control of the control device.

* * * * *